United States Patent
Wang et al.

(10) Patent No.: US 10,224,878 B2
(45) Date of Patent: Mar. 5, 2019

(54) POWER AMPLIFICATION DEVICE

(71) Applicant: Huawei Technologies Co., Ltd., Shenzhen (CN)

(72) Inventors: Yanhui Wang, Shenzhen (CN); Xikun Zhang, Shenzhen (CN); Qianhua Wei, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/698,079

(22) Filed: Sep. 7, 2017

(65) Prior Publication Data

US 2017/0373646 A1    Dec. 28, 2017

Related U.S. Application Data

(63) Continuation of application No. PCT/CN2015/074934, filed on Mar. 24, 2015.

(51) Int. Cl.
*H03F 3/68* (2006.01)
*H03F 1/07* (2006.01)
(Continued)

(52) U.S. Cl.
CPC .......... *H03F 1/07* (2013.01); *H03F 1/56* (2013.01); *H03F 3/195* (2013.01); *H03F 3/20* (2013.01);
(Continued)

(58) Field of Classification Search
CPC .................. H03F 1/0288; H03F 3/68
(Continued)

(56) References Cited

U.S. PATENT DOCUMENTS 5,105,167 A * 4/1992 Peczalski ............ H03F 3/601
                                              330/286
5,172,072 A * 12/1992 Willems ............. H03F 1/3223
                                              330/149
(Continued)

FOREIGN PATENT DOCUMENTS

CN       1858991 A      11/2006
CN     101510758 A       8/2009
(Continued)

OTHER PUBLICATIONS

Machine Translation and Abstract of Chinese Publication No. CN1858991, Nov. 8, 2006, 21 pages.
(Continued)

*Primary Examiner* — Steven J Mottola
(74) *Attorney, Agent, or Firm* — Conley Rose, P.C.

(57) ABSTRACT

A power amplification device, including a first amplification branch, a second amplification branch, a harmonic injection circuit, and a first output matching circuit. A first amplifier in the first amplification branch supports a first frequency. A second amplifier in the second amplification branch supports the first frequency and a second frequency, and the second amplifier is turned off for a signal of the first frequency that has a power value lower than an enabling threshold. The harmonic injection circuit injects a signal of the second frequency that is input from a second input terminal (I2) to a signal of the first frequency that is input from a first input terminal (I1) to obtain a signal of the first frequency that has undergone harmonic injection.

20 Claims, 5 Drawing Sheets

(51) Int. Cl.
*H03F 3/20* (2006.01)
*H03F 1/56* (2006.01)
*H03F 3/195* (2006.01)
*H03F 3/21* (2006.01)
*H03F 3/24* (2006.01)
*H03F 3/60* (2006.01)

(52) U.S. Cl.
CPC ............ *H03F 3/211* (2013.01); *H03F 3/245* (2013.01); *H03F 3/602* (2013.01); *H03F 2200/387* (2013.01); *H03F 2200/451* (2013.01)

(58) Field of Classification Search
USPC .............................................. 330/124 R, 295
See application file for complete search history.

(56) References Cited

U.S. PATENT DOCUMENTS

| | | |
|---|---|---|
| 2003/0071684 A1 | 4/2003 | Noori |
| 2009/0201089 A1 | 8/2009 | Kawanabe et al. |
| 2013/0241657 A1 | 9/2013 | Cho et al. |
| 2018/0241352 A1* | 8/2018 | Wang ................... H03F 1/0288 |

FOREIGN PATENT DOCUMENTS

| | | | |
|---|---|---|---|
| JP | H11112252 A | 4/1999 | |
| JP | 2010154459 A | 7/2010 | |
| JP | 2011040869 A | 2/2011 | |

OTHER PUBLICATIONS

Machine Translation and Abstract of Japanese Publication No. JP2010154459, Jul. 8, 2010, 17 pages.
Machine Translation and Abstract of Japanese Publication No. JP2011040869, Feb. 24, 2011, 16 pages.
Machine Translation and Abstract of Japanese Publication No. JPH11112252, Apr. 23, 1999, 8 pages.
Dani, A., et al., "Linearization of Efficient Haraionically-Injected PAs," PAWR 2013, pp. 31-33.
Dani, A., et al., "4W X-Band High Efficiency MMIC PA with Output Harmonic Injection," Proceedings of the 9th European Microwave Integrated Circuits Conference, Oct. 6-7, 2014, pp. 389-392.
Foreign Communication From a Counterpart Application, European Application No. 15885843.1, Extended European Search Report dated Nov. 29, 2017, 9 pages.
Foreign Communication From a Counterpart Application, PCT Application No. PCT/CN2015/074934, English Translation of International Search Report dated Dec. 31, 2015, 2 pages.
Foreign Communication From a Counterpart Application, PCT Application No. PCT/CN2015/074934, English Translation of Written Opinion dated Dec. 31, 2015, 5 pages.

* cited by examiner

POWER AMPLIFICATION DEVICE

CROSS-REFERENCE TO RELATED APPLICATION

This application is a continuation of International Patent Application No. PCT/CN2015/074934 filed on Mar. 24, 2015, which is hereby incorporated by reference in its entirety.

TECHNICAL FIELD

The present disclosure relates to the communications field, and in particular, to a power amplification device.

BACKGROUND

In radar and communications systems, demands for efficient wideband radio frequency transmitters gradually increase. Critical factors affecting efficiency of a radio frequency transmitter include battery costs, an energy expense of an electrical communications system, a weight of a power supply, an operating time, a size of a cooling system, and the like. Improvement of efficiency of a power amplifier, which is an important part of a radio frequency transmitter and a radio frequency receiver, is of crucial importance.

Figure 1A:
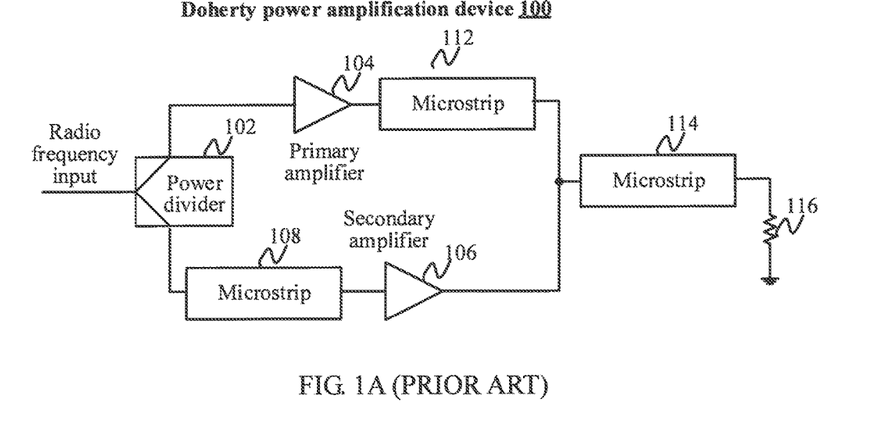
FIG. 1A is a schematic structural diagram of a typical Doherty power amplification device in the prior art.

Efficiency of a power amplifier refers to a ratio of output power of the power amplifier to power consumption of the power amplifier. Generally, a voltage and a current of the amplification device need to be shaped, to achieve high power and high efficiency. In a communications system, generally an efficiency enhancement technology based on a Doherty circuit structure is used. This technology can greatly increase efficiency at a back-off point. FIG. 1A is a schematic structural diagram of a typical Doherty power amplification device 100. The Doherty power amplification device 100 mainly includes a power divider 102, which receive the radio frequency input, a primary amplifier 104, a secondary amplifier 106, and various microstrips 108, 112, 114, and 116 for impedance matching. The primary amplifier 104 is also referred to as a main amplifier, the secondary amplifier 106 is also referred to as a peak amplifier, and both the primary amplifier 104 and the secondary amplifier 106 operate in a fundamental frequency band. When power of an input signal is lower than an enabling threshold, the secondary amplifier 106 is turned off, the primary amplifier 104 operates in a high-impedance state, and back-off efficiency at a saturation point is relatively high. When power of an input signal is greater than an enabling threshold, the secondary amplifier 106 is turned on, and a fundamental signal that is output by the secondary amplifier 106 and a fundamental signal that is output by the primary amplifier 104 are combined using an output network to achieve an effect of load pulling.

To further improve efficiency of the Doherty power amplification device 100, a harmonic injection technology may be introduced to the Doherty power amplification device 100. However, because the Doherty power amplification device 100 includes at least two amplifiers, if one or more harmonic amplifiers are further introduced, a circuit structure of the Doherty power amplification device 100 becomes quite complex, and costs and an area also become unacceptable. Therefore, how to design a power amplification device having a simple structure and relatively high efficiency is a problem that needs to be urgently resolved.

SUMMARY

Embodiments of the present disclosure provide a power amplification device, where in addition to achieving high efficiency, the power amplification device has a simple circuit structure.

According to a first aspect, an embodiment of the present disclosure provides a power amplification device, including a first amplification branch, a second amplification branch, a harmonic injection unit, and a first output matching unit, where the first amplification branch includes a first amplifier, where the first amplifier supports a first frequency. The second amplification branch includes a second amplifier, where the second amplifier supports the first frequency and a second frequency, the second amplifier is turned off for an input signal of the first frequency that has a power value lower than an enabling threshold, the second frequency is N times the first frequency, and N is an integer greater than 1, and the harmonic injection unit includes a first input terminal I1, a second input terminal I2, a first output terminal O1, and a second output terminal O2, and the first output matching unit includes a third input terminal I3 and a fourth input terminal I4, where an output terminal of the first amplification branch is connected to the first input terminal I1 of the harmonic injection unit, an output terminal of the second amplification branch is connected to the second input terminal I2 of the harmonic injection unit, the first output terminal of the harmonic injection unit is connected to the third input terminal I3 of the first output matching unit, and the second output terminal O2 of the harmonic injection unit is connected to the fourth input terminal I4 of the first output matching unit. The harmonic injection unit injects an input signal of the second frequency that is input from the second input terminal I2 to an input signal of the first frequency that is input from the first input terminal I1 to obtain an input signal of the first frequency that has undergone harmonic injection. The first output terminal O1 is turned on for the signal of the first frequency that is input from the first input terminal I1, the second output terminal O2 is turned on for a signal of the first frequency that is input from the second input terminal I2, and the first output terminal O1 and the second output terminal O2 are open for the signal of the second frequency, and the first output matching unit is configured to combine signals that are input from the third input terminal I3 and the fourth input terminal I4, and output a combined signal.

In a first possible implementation manner, the first frequency is a fundamental frequency, and the second frequency is an $N^{th}$ order harmonic frequency.

With reference to the foregoing possible implementation manner, in a second possible implementation manner, the harmonic injection unit includes a harmonic injection subunit, a first matching subunit, and a second matching subunit, where a first terminal of the harmonic injection subunit is separately connected to the first input terminal I1 and one terminal of the first matching subunit, and a second terminal of the harmonic injection subunit is separately connected to the second input terminal I2 and one terminal of the second matching subunit, where the harmonic injection subunit is open for the signal of the first frequency, and is turned on for the input signal of the second frequency that is input from the second input terminal I2. The other terminal of the first matching subunit is connected to the first output terminal O1, where the first matching subunit is turned on for the input signal of the first frequency, and is open for the input signal of the second frequency, and the other terminal of the second matching subunit is connected to the second output terminal O2, where the second matching subunit is turned on for the signal of the first frequency that is input from the second input terminal I2, and is open for the signal of the second frequency that is input from the second input terminal I2.

With reference to the foregoing possible implementation manners, in a third possible implementation manner, the harmonic injection subunit includes a quarter-wave line corresponding to the first frequency. The first matching subunit includes a first quarter-wave line corresponding to the second frequency and a second quarter-wave line corresponding to the second frequency, where one terminal of the first quarter-wave line is connected to the first terminal of the harmonic injection subunit, and the other terminal is separately connected to the first output terminal O1 and one terminal of the second quarter-wave line, and the other terminal of the second quarter-wave line is open, and the second matching subunit includes a third quarter-wave line corresponding to the second frequency and a fourth quarter-wave line corresponding to the second frequency, where one terminal of the third quarter-wave line is connected to the second terminal of the harmonic injection subunit, and the other terminal is separately connected to the second output terminal O2 and one terminal of the fourth quarter-wave line, and the other terminal of the fourth quarter-wave line is open.

With reference to the foregoing possible implementation manners, in a fourth possible implementation manner, the second amplification branch further includes a second output matching unit, where an input terminal of the second output matching unit is connected to an output terminal of the second amplifier.

With reference to the foregoing possible implementation manners, in a fifth possible implementation manner, the second output matching unit includes an inductance element and a capacitance element connected in parallel to the inductance element.

With reference to the foregoing possible implementation manners, in a sixth possible implementation manner, the first output matching unit includes a first branch matching subunit, a second branch matching subunit, and a combination matching subunit, where one terminal of the first branch matching subunit is connected to the third input terminal I3, and the other terminal is connected to the combination matching subunit, and one terminal of the second branch matching subunit is connected to the fourth input terminal I4, and the other terminal is connected to the combination matching subunit.

With reference to the foregoing possible implementation manners, in a seventh possible implementation manner, the power amplification device further includes a signal processing unit, where output terminals of the signal processing unit are respectively connected to an input terminal of the first amplification branch and an input terminal of the second amplification branch, and the signal processing unit is configured to input a first input signal of the first frequency to the first amplification branch, and input a second input signal to the second amplification branch, where the second input signal includes a first signal component of the first frequency and a second signal component of the second frequency.

With reference to the foregoing possible implementation manners, in an eighth possible implementation manner, the signal processing unit includes a power divider and a filter, where an output terminal of the power divider is separately connected to an input terminal of the filter and the input terminal of the second amplification branch, and an output terminal of the filter is connected to the input terminal of the first amplification branch.

With reference to the foregoing possible implementation manners, in a ninth possible implementation manner, a power value of the first signal component is lower than a power value of the second signal component, and the power value of the second signal component is greater than or equal to the enabling threshold.

With reference to the foregoing possible implementation manners, in a tenth possible implementation manner, the power amplification device further includes a third amplification branch, where the third amplification branch includes a third amplifier supporting the first frequency, and the first output matching unit further includes a fifth input terminal, where an output terminal of the third amplification branch is connected to the fifth input terminal of the first output matching unit.

With reference to the foregoing possible implementation manners, in an eleventh possible implementation manner, the first input signal of the first frequency is input from the input terminal of the first amplification branch, and the first amplification branch is configured to perform amplification processing on the first input signal to obtain the first input signal having undergone amplification processing, and input the first input signal having undergone amplification processing to the harmonic injection unit from the first input terminal I1 of the harmonic injection unit. The second input signal is input from the input terminal of the second amplification branch, where the second input signal includes the first signal component of the first frequency and the second signal component of the second frequency, and the second amplification branch is configured to perform amplification processing on the second input signal to obtain the second input signal having undergone amplification processing, and output the second input signal having undergone amplification processing to the harmonic injection unit from the second input terminal I2 of the harmonic injection unit, where the second input signal having undergone amplification processing includes the second signal component having undergone amplification processing. The harmonic injection unit is configured to inject the second signal component that has undergone amplification processing and that is input from the second input terminal I2 to the first input signal that has undergone amplification processing and that is input from the first input terminal I1 to obtain the first input signal having undergone harmonic injection, and output the first input signal having undergone harmonic injection from the first output terminal O1, and the first output matching unit is configured to receive the first input signal that has undergone harmonic injection and that is input from the third input terminal I3, and output the first input signal having undergone harmonic injection.

With reference to the foregoing possible implementation manners, in a twelfth possible implementation manner, if the power value of the first signal component is greater than or equal to the enabling threshold, the second input signal having undergone amplification processing further includes the first signal component having undergone amplification processing, and the second amplification branch is further configured to output the first signal component having undergone amplification processing to the harmonic injection unit from the second input terminal I2. The harmonic injection unit is further configured to output the first signal component having undergone amplification processing to the first output matching unit from the fourth input terminal I4, and the first output matching unit is further configured to perform combination processing on the first input signal that has undergone amplification processing and that is input from the third input terminal I3 and the first signal component that has undergone amplification processing and that is input from the fourth input terminal I4 to obtain a combined signal, and output the combined signal.

Based on the foregoing technical solutions, the power amplification device provided in the embodiments of the present disclosure includes a first amplification branch supporting a first frequency, a second amplification branch supporting the first frequency and a second frequency, a harmonic injection unit, and a first output matching unit for impedance matching. The harmonic injection unit injects a signal of the second frequency that is output from the second amplification branch to a signal of the first frequency that is output from the first amplification branch. Power of an output signal of the power amplification device can be increased, and in addition to achieving high efficiency, the power amplification device has a simple circuit structure.

BRIEF DESCRIPTION OF DRAWINGS

To describe the technical solutions in the embodiments of the present disclosure more clearly, the following briefly describes the accompanying drawings required for describing the embodiments of the present disclosure. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are a part rather than all of the embodiments of the present disclosure. All other embodiments obtained by a person of ordinary skill in the art based on the embodiments of the present disclosure without creative efforts shall fall within the protection scope of the present disclosure.

Figure 1B:
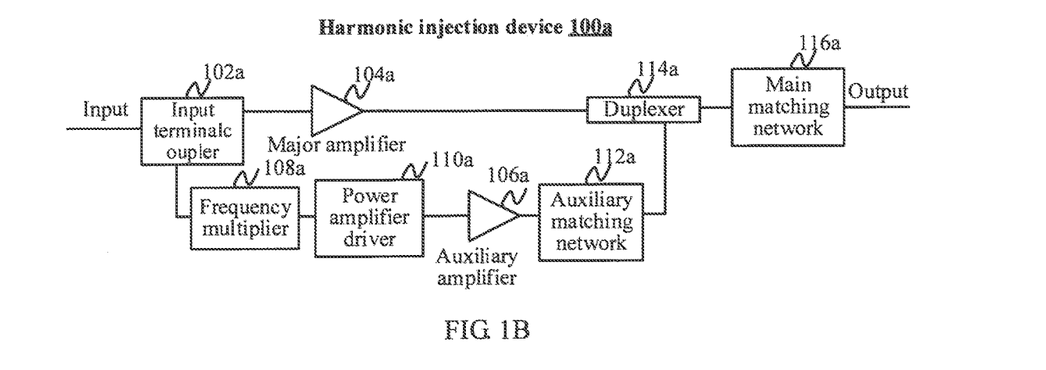
FIG. 1B is a block circuit diagram of a harmonic injection device.

FIG. 1B is a block circuit diagram of a harmonic injection device 100a. As shown in FIG. 1B, the harmonic injection device 100a includes four parts, an input terminal coupler 102a, a major amplification branch (including a major amplifier 104a), an auxiliary amplification branch (including a frequency multiplier 108a, a power amplifier driver 110a, an auxiliary amplifier 106a, and an auxiliary matching network 112a), and an output matching network (including a duplexer 114a and a main matching network 116a). The input terminal coupler 102a is configured to couple a fundamental signal to the auxiliary amplification branch, the frequency multiplier 108a performs frequency multiplication on the fundamental signal to obtain a harmonic signal, and then the auxiliary amplifier 106a performs amplification on the harmonic signal. The output matching network is configured to perform combination on signals from the major amplification branch and the auxiliary amplification branch, and perform output matching for the major amplifier 104a and the auxiliary amplifier 106a. During normal operation, the auxiliary amplifier 106a of the auxiliary amplification branch is turned on, and outputs power signal in a harmonic frequency band, and the power is combined with a main signal using a combination circuit in the output matching network to implement active harmonic injection.

Figure 1C:
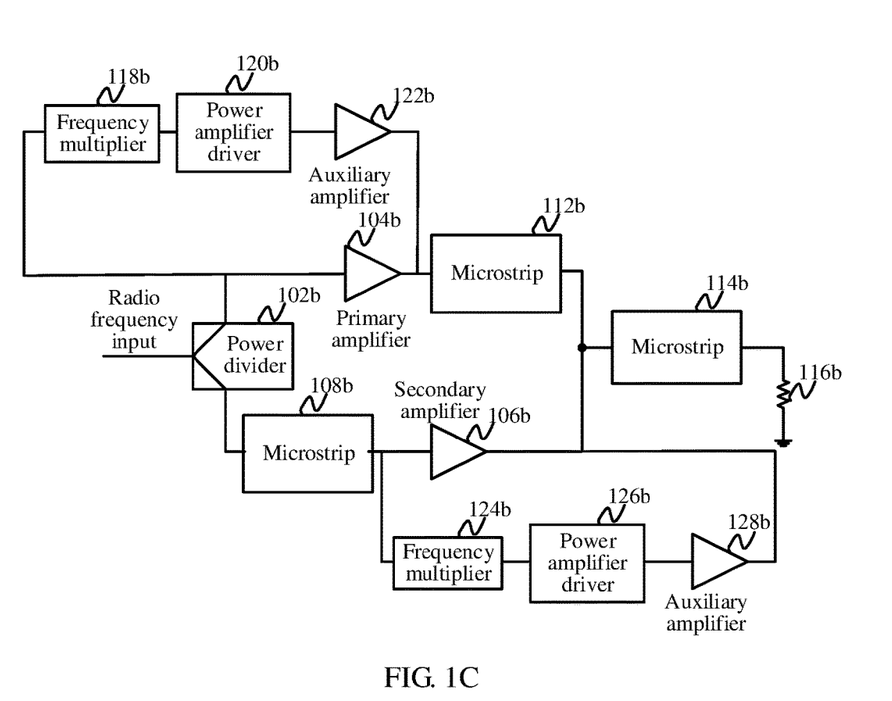
FIG. 1C is a diagram of a harmonic injection structure based on a classical two-stage Doherty amplifier.

FIG. 1C is a diagram of a harmonic injection structure based on a classical two-stage Doherty amplifier. As shown in FIG. 1C, to apply a harmonic injection structure to a Doherty amplifier, an amplifier operating in a harmonic frequency band needs to be separately added to a major amplifier (that is, a main amplifier) and an auxiliary amplifier (that is, a peak amplifier). In FIG. 1C, a primary amplifier 104b is a major amplifier in a Doherty structure, and a secondary amplifier 106b is an auxiliary amplifier, and two power tubes combine at an output part. In a use process, load pulling is implemented between the two branches to achieve a purpose of improving efficiency of the power tubes. Now the concept in FIG. 1B is introduced into a Doherty amplifier. The structure in FIG. 1C may be obtained using each amplifier in FIG. 1B as the primary amplifier in FIG. 1A, and newly adding an auxiliary harmonic injection amplifier for each primary amplifier. In an embodiment, similar to FIG. 1A, FIG. 1C includes the primary amplifier 104b, the secondary amplifier 106b, a power divider 102b, and microstrips 108b, 112b, 114b, and 116b. In addition to foregoing components, similar to FIG. 1B, FIG. 1C further includes frequency multipliers 118b and 124b, power amplifier drivers 120b and 126b, and auxiliary amplifiers 122b and 128b. In this structure, a quantity of amplifiers increases to four, a circuit is excessively complex, a relatively large area is occupied, and costs also further increase. This is not an ideal solution.

The present disclosure provides a power amplification device having a simple circuit structure, where a harmonic injection technology can be introduced on a basis of a Doherty amplifier to inject a harmonic signal into a fundamental signal that is output by a primary amplifier, bringing relatively high efficiency.

It should be understood that, the technical solutions in the embodiments of the present disclosure are applicable to various communications systems, for example, a Global System for Mobile Communications (GSM) system, a Code Division Multiple Access (CDMA) system, a Wideband Code Division Multiple Access (WCDMA) system, a general packet radio service (GPRS), a Long Term Evolution (LTE) system, an LTE frequency division duplex (FDD) system, an LTE time division duplex (TDD) system, a Universal Mobile Telecommunications System (UMTS), a Worldwide Interoperability for Microwave Access (WI-MAX) communications system, and a subsequent evolved communications system such as a fifth generation (5G) communications system.

Further, the power amplification device provided in the embodiments of the present disclosure may be a circuit, or may be a chip. The power amplification device provided in the embodiments of the present disclosure may be applied to an access network device. The access network device may be a base transceiver station (BTS) in GSM or CDMA, or may be a NodeB in WCDMA, or may be an evolved Node B (eNB or e-NodeB) in LTE, or an access network device or network node in the 5G communications system. This is not limited in the present disclosure.

It should also be understood that, the technical solutions in the embodiments of the present disclosure may also be applied to other systems, for example, a radar system and an audio processing system. This is not limited in the embodiments of the present disclosure.

Figure 2:
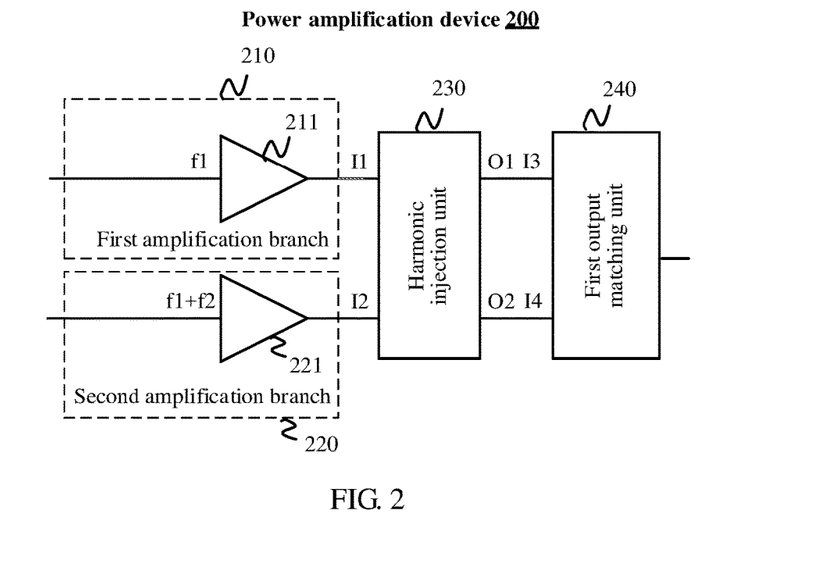
FIG. 2 is a schematic structural diagram of a power amplification device according to an embodiment of the present disclosure.

FIG. 2 is a schematic block diagram of a power amplification device 200 according to an embodiment of the present disclosure. As shown in FIG. 2, the power amplification device 200 includes a first amplification branch 210, a second amplification branch 220, a harmonic injection unit 230, and a first output matching unit 240, where the first amplification branch 210 includes a first amplifier 211, where the first amplifier 211 supports a first frequency, and the second amplification branch 220 includes a second amplifier 221, where the second amplifier 221 supports the first frequency and a second frequency, the second amplifier 221 is turned off for an input signal of the first frequency that has a power value lower than an enabling threshold, the second frequency is N times the first frequency, and N is an integer greater than 1.

For ease of description in the following, the first frequency is referred to as f1, and the second frequency is referred to as f2.

In a specific example, the first amplifier 211 included in the first amplification branch 210 may operate at the f1. The first amplifier 211 may operate as a class AB amplifier or a class B amplifier, and the first amplifier 211 may be turned on for input signals of various frequency values. Optionally, the first amplification branch 210 may further include a first input matching unit (not shown). If another element is disposed before the first input matching unit in the first amplification branch 210, an input terminal of the first input matching unit may be coupled to an output terminal of the other element. If no other element is disposed before the first input matching unit in the first amplification branch 210, an input terminal of the first amplification branch 210 may be the input terminal of the first input matching unit. This is not limited in this embodiment of the present disclosure.

In addition, an output terminal of the first input matching unit may be coupled to an input terminal of the first amplifier 211. This is not limited in this embodiment of the present disclosure. The coupling may be direct connection or connection by means of another component, for example, connection by means of a resistor, a capacitor, or an inductor. This is not limited in this embodiment of the present disclosure. Optionally, the output terminal of the first input matching unit may be connected to the input terminal of the first amplifier 211. The first input matching unit may be configured to perform impedance matching to implement matching between an impedance of the first amplifier 211 and that of an element disposed before the first amplifier 211. For example, from a perspective at an input terminal point of the first amplifier 211, impedances on two sides of the input terminal point are equal. This is not limited in this embodiment of the present disclosure.

In a specific example, the second amplification branch 220 may include the second amplifier 221, and the second amplifier 221 operates at the f1 and the f2. The second amplifier 221 may operate as a class C amplifier. This is not limited in this embodiment of the present disclosure.

According to the Doherty principle, in a case of back-off, the second amplifier 221 has no amplification effect on a fundamental wave (that is, an input signal of the f1). Therefore, an enabling threshold is set for the f1 at the second amplifier 221, and only when a power value of the input signal of the f1 exceeds the enabling threshold, the second amplifier 221 performs amplification on the input signal of the f1. The enabling threshold may be a specific value, or fall within a value range. This is not limited in this embodiment of the present disclosure.

In a specific example, the second amplifier 221 may be frequency sensitive. For example, the second amplifier 221 may have an enabling threshold for only a signal of the f1, and may be always turned on for a signal of the f2. Alternatively, the second amplifier 221 may have different amplification gains for a signal of the f1 and a signal of the f2 such that even when a signal of the f2 that has a relatively small power value is input, the second amplifier 221 can still output the signal of the f2 that has undergone amplification. This is not limited in this embodiment of the present disclosure.

In another specific example, the second amplification branch 220 may further include a second input matching unit (not shown). If another element is disposed before the second input matching unit in the second amplification branch 220, an input terminal of the second input matching unit may be coupled to an output terminal of the other element. If no element is disposed before the second input matching unit in the second amplification branch 220, an input terminal of the second amplification branch 220 may be the input terminal of the second input matching unit. This is not limited in this embodiment of the present disclosure. In addition, an output terminal of the second input matching unit may be coupled to an input terminal of the second amplifier 221. The coupling may be direct connection or connection by means of another component, for example, connection by means of a resistor, a capacitor, or an inductor. This is not limited in this embodiment of the present disclosure. The second input matching unit may be configured to perform impedance matching to implement matching between an impedance of the second amplifier 221 and that of an element disposed before the second amplifier 221. For example, from a perspective at an input terminal point of the second amplifier 221, impedances on two sides of the input terminal point are equal. This is not limited in this embodiment of the present disclosure.

In another optional embodiment, the second amplification branch 220 may further include a second output matching unit (not shown), where an input terminal of the second output matching unit may be coupled to an output terminal of the second amplifier 221. The second output matching unit may be configured to perform impedance matching to implement matching between an impedance of the second amplifier 221 and that of a load of the second amplifier 221. For example, from a perspective at an output terminal point of the second amplifier 221, impedances on two sides of the output terminal point are equal. Further, the second output matching unit may implement that the second amplifier 221 and the load of the second amplifier 221 match at both the f1 and the f2. This is not limited in this embodiment of the present disclosure.

The second output matching unit may present a needed matched impedance at both the f1 and the f2 such that the second amplifier 221 can have an amplification function in a relatively wide bandwidth. The second output matching unit may be implemented in multiple manners. In an optional embodiment, the second output matching unit includes an inductance element and a capacitance element connected in parallel to the inductance element.

The inductance element and the capacitance element connected in parallel to the inductance element may act as a subunit, and the second output matching unit may include one subunit or multiple subunits connected in series. This is not limited in this embodiment of the present disclosure. Optionally, the second output matching unit may also be implemented using a n-type circuit, a T-type circuit, a matching line, or another form. This is not limited in this embodiment of the present disclosure.

The first amplification branch 210 and the second amplification branch 220 are described in detail above. The harmonic injection unit 230 is described in detail below.

Referring to FIG. 2, the harmonic injection unit 230 includes a first input terminal I1, a second input terminal I2, a first output terminal O1, and a second output terminal O2. The first output matching unit 240 includes a third input terminal I3 and a fourth input terminal I4.

An output terminal of the first amplification branch 210 is connected to I1 of the harmonic injection unit 230, an output terminal of the second amplification branch 220 is connected to I2 of the harmonic injection unit 230, O1 of the harmonic injection unit 230 is connected to I3 of the first output matching unit 240, and O2 of the harmonic injection unit 230 is connected to I4 of the first output matching unit 240.

The harmonic injection unit 230 injects an input signal of the f2 that is input from I2 to an input signal of the f1 that is input from I1 to obtain an input signal of the f1 that has undergone harmonic injection.

O1 is turned on for the signal of the f1 that is input from I1, O2 is turned on for a signal of the f1 that is input from I2, and O1 and O2 are open for the input signal of the f2.

Therefore, the power amplification device 200 according to this embodiment of the present disclosure includes the first amplification branch 210 supporting the f1, the second amplification branch 220 supporting the f1 and the f2, the harmonic injection unit 230, and the first output matching unit 240 configured to perform combination. The harmonic injection unit 230 injects a signal of the f2 that is output from the second amplification branch 220 to a signal of the f1 that is output from the first amplification branch 210. Power of an output signal of the power amplification device 200 can be increased, and in addition to achieving high efficiency, the power amplification device 200 has a simple circuit structure.

Figure 3:
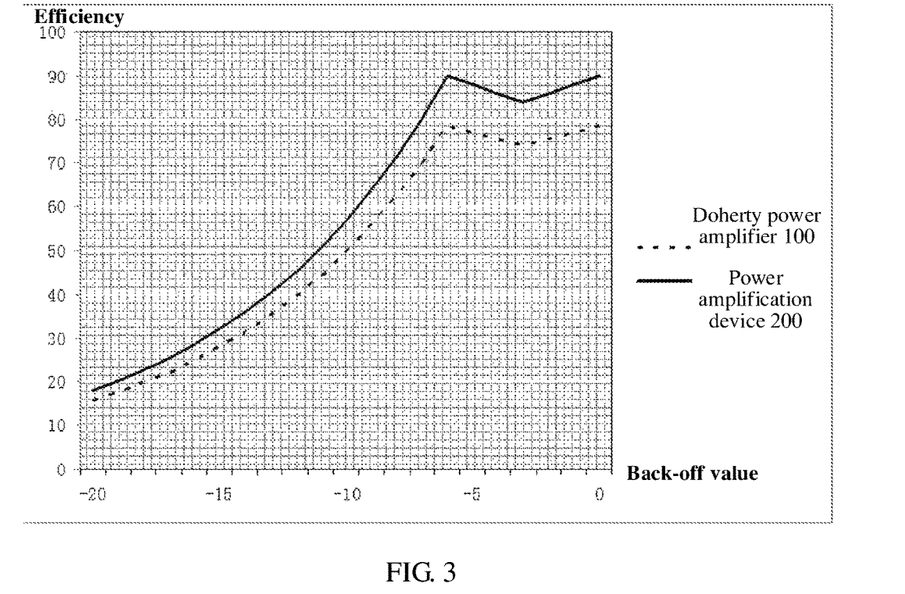
FIG. 3 is a schematic diagram of efficiency curves of a power amplification device according to an embodiment of the present disclosure and a Doherty amplifier.

The power amplification device 200 applies both a Doherty circuit design principle and a harmonic injection technology, and has a simple structure. Moreover, compared with a Doherty power amplification device and a harmonic injection structure based on a single amplifier, the power amplification device 200 has higher efficiency. FIG. 3 schematically shows curves of efficiency (multiplied by 0.01 in measurement) relative to a power back-off value (in decibel (dB)) for the power amplification device 200 provided in this embodiment of the present disclosure and a Doherty power amplification device 100. As shown in FIG. 3, the power amplification device 200 provided in this embodiment of the present disclosure and the Doherty power amplification device 100 have same saturation output power, while for a same power back-off value, efficiency of the power amplification device 200 is higher than efficiency of the existing Doherty power amplification device 100. Further, the Doherty power amplification device 100 reaches a highest efficiency value 78.5% for saturation output power (that is, a back-off value is zero) and for a back-off value of 6 dB relative to the saturation output power, while the power amplification device 200 provided in this embodiment of the present disclosure reaches a highest efficiency value 90% for saturation output power and for a back-off value of 6 dB relative to the saturation output power.

It should be understood that, in this embodiment of the present disclosure, the term "a signal of a first frequency f1" may refer to a signal whose frequency components include only the f1, where the signal may not include another frequency other than the f1, or the signal may be a narrow-band signal having a particular width, where frequencies of the narrow-band signal include the f1, the term "a signal of a second frequency f2" is a signal whose frequency components include only the f2, where the signal may not include another frequency other than the f2, or the signal may be a narrow-band signal having a particular width, where frequencies of the narrow-band signal include the f2. Similarly, the term "an amplifier supporting a first frequency f1" may refer to an amplifier operating at the f1 or in a narrow-band frequency band including the f1, and the term "an amplifier supporting a second frequency f2" may refer to an amplifier operating at the f2 or in a narrow-band frequency band including the f2. This is not limited in this embodiment of the present disclosure.

Optionally, the f1 is a fundamental frequency, and the f2 is an $N^{th}$ order harmonic frequency. In this case, the first amplifier 211 operates in a fundamental frequency band f1, and the second amplifier 221 not only operates in the fundamental frequency band f1, but also operates in a harmonic frequency band Nxf1, where N is an integer greater than 1, and a value of N may be determined according to an actual need. For example, the f2 is a second order harmonic frequency. In this case, a fundamental signal may be input to the first amplifier 211, and a second order harmonic signal and a fundamental signal may be input to the second amplifier 221. This is not limited in this embodiment of the present disclosure.

In this embodiment of the present disclosure, the harmonic injection unit 230 may inject a harmonic signal that is output from the second amplification branch 220 to a signal of the f1 that is output from the first amplification branch 210. Further, the harmonic injection unit 230 may inject the signal of the f2 that is input from I2 to the signal of the f1 that is input from I1, and the signal of the f2 that is injected into the signal of the f1 may change a waveform of the signal of the f1. This can achieve a purpose of improving efficiency of the power amplification device 200.

Further, compared with a Doherty power amplification device, the power amplification device 200 provided in this embodiment of the present disclosure uses a harmonic injection technology. The signal of the f2 is injected into the signal of the f1 to change a frequency spectrum component included in an output signal and adjust a relative phase between a current and a voltage in the output signal. This can achieve a purpose of reducing direct current power consumption, and therefore improve efficiency of the power amplification device without changing output power.

In addition, in the harmonic injection unit 230, I1 may be corresponding to O1, and I2 may be corresponding to O2.

For a signal of the f1 that is input from an input terminal corresponding to either output terminal of the harmonic injection unit 230, the output terminal may be turned on, that is, present a low impedance (for example, an impedance is approximately zero), while for a signal of the f1 that is input from an input terminal that is not corresponding to the output terminal, the output terminal may present a high impedance (for example, open). That is, a signal of the f1 that is input from I1 may be output from O1, and a signal of the f1 that is input from I2 may be output from O2, while a signal of the f1 that is input from I2 cannot be output from O1, and a signal of the f1 that is input from I1 cannot be output from O2. In this way, the harmonic injection unit 230 can have a separation function, and can prevent occurrence of the following case. Because a signal of the f1 that is output from the first amplification branch 210 is transmitted to the second amplification branch 220 and a signal of the f1 that is output from the second amplification branch 220 is transmitted to the first amplification branch 210, output power of the power amplification device 200 is decreased, and then efficiency of the power amplification device 200 is decreased.

Further, if a signal of the f1 is input from I2, the harmonic injection unit 230 may output the signal of the f1 from O2. In this case, a signal of the f1 that is from the first amplification branch 210 and that has undergone harmonic injection is input from I3 of the first output matching unit 240, a signal of the f1 that is from the second amplification branch 220 is input from I4, and the first output matching unit 240 may perform combination processing on the signal that is input from I3 and the signal that is input from I4 to obtain a combined signal, and output the combined signal. In this case, the signal of the f1 that is input from I4 can have a load pulling function. Further, the signal that is input from the third input terminal I3 and the signal that is input from the fourth input terminal I4 are transmitted to a same end point, causing a voltage at the end point to change relative to a case in which a signal is input from only the third input terminal I3, and a current that is input from the third input terminal I3 does not change. For a branch corresponding to the third input terminal I3 or the fourth input terminal I4, an impedance is equal to a voltage divided by a current in the branch. Therefore, a voltage of the branch corresponding to the third input terminal I3 changes while a current remains unchanged, which causes an impedance of this branch to change. That is, a current input from the fourth input terminal I4 causes the impedance of the branch corresponding to the third input terminal I3 to change, and causes a combination impedance of the branch corresponding to the third input terminal I3 and the branch corresponding to the fourth input terminal I4 to change. This is not limited in this embodiment of the present disclosure.

Figure 4:
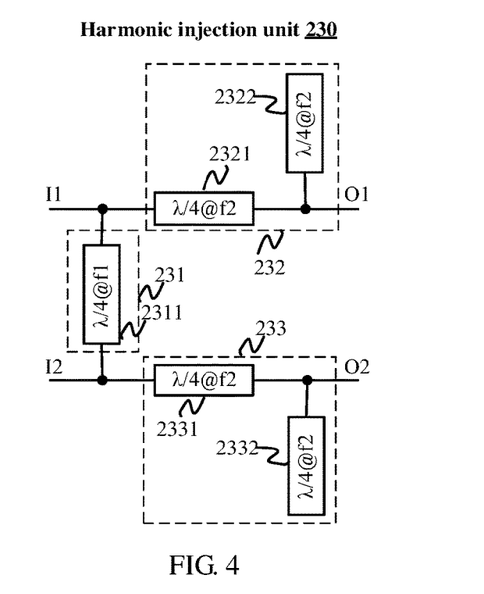
FIG. 4 is a schematic structural diagram of a harmonic injection unit in a power amplification device according to an embodiment of the present disclosure.

In an optional embodiment, as shown in FIG. 4, the harmonic injection unit 230 includes a harmonic injection subunit 231, a first matching subunit 232, and a second matching subunit 233.

A first terminal of the harmonic injection subunit 231 is separately connected to I1 and one terminal of the first matching subunit 232, and a second terminal of the harmonic injection subunit 231 is separately connected to I2 and one terminal of the second matching subunit 233, where the harmonic injection subunit 231 is open for the signal of the f1, and is turned on for the input signal of the f2 that is input from I2.

The other terminal of the first matching subunit 232 is connected to the first output terminal O1, where the first matching subunit 232 is turned on for the input signal of the f1, and is open for the input signal of the f2.

The other terminal of the second matching subunit 233 is connected to O2, where the second matching subunit 233 is turned on for the input signal of the f1 that is input from I2, and is open for the signal of the f2 that is input from I2.

Further, the harmonic injection subunit 231 may inject the signal of the f2 that is input from I2 to the signal of the f1 that is input from I1, and may prevent the signal of the f1 that is input from I1 from being transmitted to the second matching subunit 233 and/or prevent the signal of the f1 that is input from I2 from being transmitted to the first matching subunit 232, thereby avoiding a decrease in power of an output signal caused therefrom. The first matching subunit 232 and the second matching subunit 233 may present a high impedance, for example, is open, for the signal of the f2, and may be turned on, that is, present a low impedance, for the signal of the f1, for example, the impedance is approximately zero. In this way, the signal of the f1 from I1 may pass through the first matching subunit 232, and the signal of the f1 from I2 may pass through the second matching subunit 233, and the signal of the f2 from I2 cannot pass through the first matching subunit 232 and the second matching subunit 233. This is not limited in the present disclosure.

The harmonic injection subunit 231, the first matching subunit 232, and the second matching subunit 233 may be implemented in multiple manners. In an optional embodiment, as shown in FIG. 4, the harmonic injection subunit 231 includes a quarter-wave transmission line (represented by λ/4@f1) 2311 corresponding to the f1.

The first matching subunit 232 includes a first quarter-wave transmission line (represented by λ/4@f2) 2321 corresponding to the f2 and a second quarter-wave transmission line (represented by λ/4@f2) 2322 corresponding to the f2, where one terminal of λ/4@f2 2321 is connected to the first terminal of the harmonic injection subunit 231, and the other terminal is separately connected to O1 and one terminal of λ/4@f2 2322, and the other terminal of λ/4@f2 2322 is open.

The second matching subunit 233 includes a third quarter-wave transmission line (represented by λ/4@f2) 2331 corresponding to the f2 and a fourth quarter-wave transmission line (represented by λ/4@f2) 2332 corresponding to the f2, where one terminal of λ/4@f2 2331 is connected to the second terminal of the harmonic injection subunit 231, and the other terminal is separately connected to O2 and one terminal of λ/4@f2 2332, and the other terminal of λ/4@f2 2332 is open.

Generally, a quarter-wave line corresponding to a frequency can implement impedance conversion for a signal of the frequency. For example, one terminal of the quarter-wave line presents a high impedance (for example, is open) for the signal of the frequency, and the impedance for the signal of the frequency is converted to a low impedance (for example, the impedance is approximately zero) at the other terminal of the quarter-wave line, and vice versa. In addition, impedances at two terminals of a half-wave line corresponding to a frequency remain the same for a signal of the frequency.

Further, for the signal of the f1 that is input from I1, the terminal, connected to I2, of the λ/4@f1 2311 presents a low impedance (the impedance is approximately zero), and after the λ/4@f1 2311 is passed through, the terminal, connected to I1, of the λ/4@f1 2311 presents a high impedance (which is equivalent to open), thereby preventing the signal of the f1 from passing. Similarly, for the signal of the f1 that is input from I2, the terminal, connected to I1, of the λ/4@f1 2311 presents a low impedance (the impedance is approximately zero), and after the λ/4@f1 2311 is passed through, the terminal, connected to I2, of the λ/4@f1 2311 presents a high impedance (which is equivalent to open), thereby preventing the signal of the f1 from passing. In addition, the terminal, connected to I2, of the λ/4@f1 2311 presents a low impedance for the signal of the f2, thereby allowing the signal of the f2 to pass through the λ/4@f1 2311.

In the first matching subunit 232, the open terminal of the λ/4@f2 2322 is open for the signal of the f2, that is, an impedance is infinite, and after the λ/4@f2 2322 is passed through, the terminal, connected to the λ/4@f2 2321, of the λ/4@f2 2322 presents a low impedance (the impedance is approximately zero, which is equivalent to a short circuit) for the signal of the f2, and therefore is turned on for the signal of the f2. Then, after the λ/4@f2 2321 is passed through, the terminal, connected to I1, of the λ/4@f2 2321 presents a high impedance (which is equivalent to open) for the signal of the f2, thereby preventing the signal of the f2 from passing through the λ/4@f2 2321.

In addition, the first matching subunit 232 may present a low impedance (that is, the impedance is approximately zero, which is equivalent to a short circuit) for the signal of the f1 to allow the signal of the f1 to pass. For example, when the signal of the f2 is a second order harmonic wave and the signal of the f1 is a fundamental wave, a quarter-wave line corresponding to the f2 is equivalent to a half-wave line corresponding to the f1. In this case, an impedance value of the first matching subunit 232 for the signal of the f1 is approximately zero. In this way, I1 and O1 have same impedance values for the signal of the f1, and therefore do not affect subsequent impedance matching. This is not limited in this embodiment of the present disclosure.

Similarly, in the second matching subunit 233, the open terminal of the λ/4@f2 2332 is open for the signal of the f2, that is, an impedance is infinite, and after the λ/4@f2 2332 is passed through, the terminal, connected to the λ/4@f2 2331, of the λ/4@f2 2332 presents a low impedance (the impedance is approximately zero, which is equivalent to a short circuit) for the signal of the f2, and therefore is turned on for the signal of the f2. Then, after the λ/4@f2 2331 is passed through, the terminal, connected to I1, of the λ/4@f2 2331 presents a high impedance (which is equivalent to open) for the signal of the f2, thereby preventing the signal of the f2 from passing through the λ/4@f2 2331.

In addition, the second matching subunit 233 may present a low impedance (that is, the impedance is approximately zero, which is equivalent to a short circuit) for the signal of the f1 to allow the signal of the f1 to pass. For example, when the signal of the f2 is a second order harmonic wave and the signal of the f1 is a fundamental wave, a quarter-wave line corresponding to the f2 is equivalent to a half-wave line corresponding to the f1. In this case, an impedance value of the first matching subunit 232 for the signal of the f1 is approximately zero. In this way, I1 and O1 have same impedance values for the signal of the f1, and therefore do not affect subsequent impedance matching. This is not limited in this embodiment of the present disclosure.

In another optional embodiment, with respect to FIGS. 2 and 4, alternatively, the harmonic injection unit 230 may include only the harmonic injection subunit 231, and may not include the first matching subunit 232 and the second matching subunit 233. In this case, the first output matching unit 240 may present a high impedance (which is equivalent to open) for the signal of the f2 such that the signal of the f2 cannot pass through the first output matching unit 240.

This is not limited in this embodiment of the present disclosure. Optionally, when the harmonic injection unit 230 includes only the harmonic injection subunit 231, the harmonic injection subunit 231 may still include the λ/4@f1 2311. This is not limited in this embodiment of the present disclosure. The foregoing various wave transmission lines may also be replaced with other elements. This is not limited in this embodiment of the present disclosure. In addition, the harmonic injection unit 230 may be implemented using another structure. This is not limited in this embodiment of the present disclosure.

In this embodiment of the present disclosure, the first output matching unit 240 is configured to perform combination on signals that are input from I3 and I4, and output a combined signal.

In an optional embodiment, the first output matching unit 240 may include a circuit, and the circuit is used for combining a signal that is input from I3 and a signal that is input from I4 into one signal and outputting the signal. Optionally, the circuit may be implemented using a combiner. This is not limited in this embodiment of the present disclosure.

Figure 5:
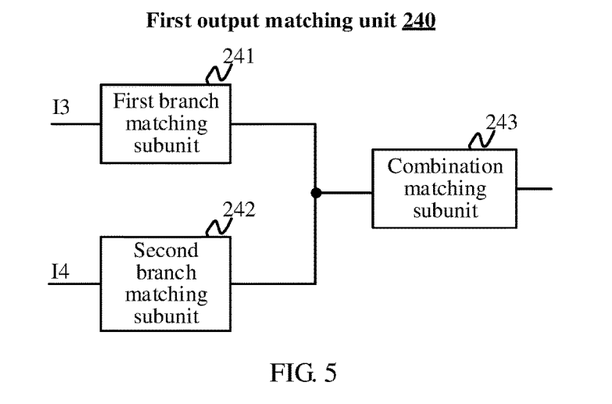
FIG. 5 is a schematic structural diagram of a first output matching unit in a power amplification device according to an embodiment of the present disclosure.

In another optional embodiment, as shown in FIG. 5, the first output matching unit 240 includes a first branch matching subunit 241, a second branch matching subunit 242, and a combination matching subunit 243.

One terminal of the first branch matching subunit 241 is connected to the third input terminal I3, and the other terminal is connected to the combination matching subunit 243.

One terminal of the second branch matching subunit 242 is connected to the fourth input terminal I4, and the other terminal is connected to the combination matching subunit 243.

In the first output matching unit 240, the first branch matching subunit 241 may be connected in parallel to the second branch matching subunit 242 and then be connected in series to the combination matching subunit 243. Further, the first branch matching subunit 241 may present a needed impedance value for the signal of the first frequency such that an equivalent impedance of a branch of the first branch matching subunit 241 matches an impedance of a load of a power amplification device, such as the power amplification device 200 shown in FIG. 2. For example, with respect to FIG. 2, an impedance of the first amplifier 211 is equal to a sum of the equivalent impedance of the branch of the first branch matching subunit 241 and the impedance of the load of the power amplification device 200. This is not limited in this embodiment of the present disclosure. Optionally, the first branch matching subunit 241 may also present a high impedance (which is equivalent to open) for the signal of the f2 to prevent the signal of the f2 from passing. This is not limited in this embodiment of the present disclosure. Similarly, the second branch matching subunit 242 may present a needed impedance value for the signal of the f1 such that an equivalent impedance of a branch of the second branch matching subunit 242 matches the impedance of the load of the power amplification device 200. For example, an impedance of the second amplifier 221 is equal to a sum of the equivalent impedance of the branch of the second branch matching subunit 242 and the impedance of the load of the power amplification device 200. This is not limited in this embodiment of the present disclosure. Optionally, the second branch matching subunit 242 may also present a high impedance (which is equivalent to open) for the signal of the f2 to prevent the signal of the f2 from passing. This is not limited in this embodiment of the present disclosure.

The first branch matching subunit 241, the second branch matching subunit 242, and the combination matching subunit 243 may be implemented using multiple circuit structures, for example, including a capacitance element, an inductance element, and a matching line. In an optional embodiment, the first branch matching subunit 241, the second branch matching subunit 242, and the combination matching subunit 243 may all include a quarter-wave transmission line corresponding to the first frequency. This is not limited in this embodiment of the present disclosure.

In addition, the first output matching unit 240 may be implemented in the other approaches, and details are not described herein.

In this embodiment of the present disclosure, with respect to the FIG. 2, the power amplification device 200 may have two input terminals. One input terminal may be coupled to the input terminal of the first amplification branch 210 and used for inputting a signal of the f1 to the first amplification branch 210, and the other input terminal may be coupled to the input terminal of the second amplification branch 220 and used for inputting a signal including the f1 and the f2 to the second amplification branch 220. This is not limited in this embodiment of the present disclosure.

Figure 6:
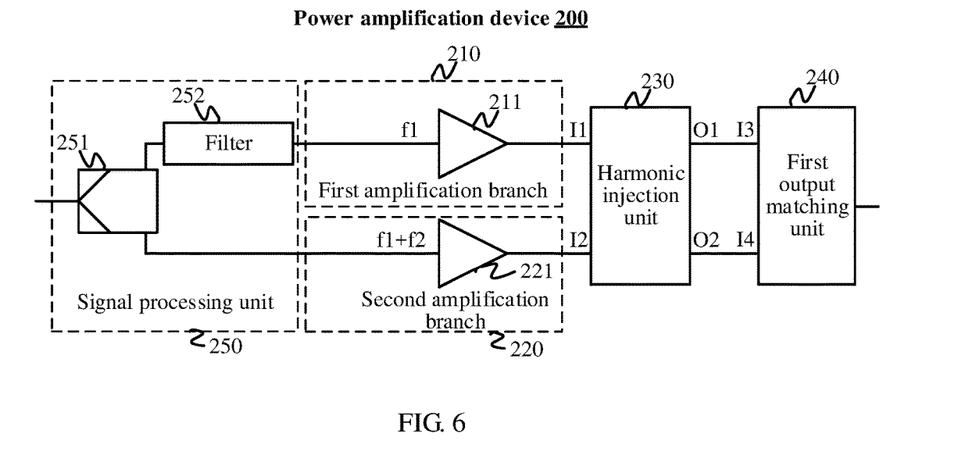
FIG. 6 is another schematic structural diagram of a power amplification device according to an embodiment of the present disclosure.

In another optional embodiment, on the basis of FIG. 1, as shown in FIG. 6, the power amplification device 200 may have one input terminal. In this case, the power amplification device 200 may perform division processing on a signal that is input from the input terminal, to obtain two signals, where one signal is a signal of the f1, and the other signal includes a signal of the f1 and a signal of the f2. Correspondingly, as shown in FIG. 6, the power amplification device 200 further includes a signal processing unit 250. Output terminals of the signal processing unit 250 are respectively connected to an input terminal of the first amplification branch 210 and an input terminal of the second amplification branch 220, and the signal processing unit 250 is configured to input a first input signal of the f1 to the first amplification branch 210, and input a second input signal to the second amplification branch 220, where the second input signal includes a first signal component of the f1 and a second signal component of the f2.

The first signal component and the second signal component may have same or different power values. Optionally, the first signal component and the second signal component may always have same power values. In this case, the second amplifier 221 may have an amplification gain value for a signal of the f1 that is less than an amplification gain value for a signal of the f2, and have a sufficiently large amplification gain value for the signal of the f2 such that the second signal component can always pass through the second amplifier 221, while only when the power value of the first signal component is greater than or equal to the enabling threshold, the first signal component can pass through the second amplifier 221. Alternatively, the power value of the first signal component may be less than the power value of the second signal component. In this case, the power value of the second signal component may be always greater than the enabling threshold of the second amplifier 221 such that the second signal component can always pass through the second amplifier 221, while the power value of the first signal component may be less than the enabling threshold in some cases, and be greater than or equal to the enabling threshold in some other cases. This is not limited in this embodiment of the present disclosure.

In an optional embodiment, the power value of the first signal component is less than the power value of the second signal component, and the power value of the second signal component is greater than or equal to the enabling threshold of the second amplifier 221.

In an optional embodiment, as shown in FIG. 6, the signal processing unit 250 includes a power divider 251 and a filter 252.

An output terminal of the power divider 251 is separately connected to an input terminal of the filter 252 and the input terminal of the second amplification branch 220.

An output terminal of the filter 252 is connected to the input terminal of the first amplification branch 210.

The power divider 251 may be a 2-way equal power divider or another power divider. The power divider 251 is configured to perform division processing on an input signal to obtain two signals. The input signal may include a signal component of the f1 and a signal component of the f2, and correspondingly, each of the two signals includes a signal component of the f1 and a signal component of the f2. One of the two signals is transmitted to the second amplification branch 220, and the other signal is transmitted to the filter 252. The filter 252 may be a band-pass filter. The f1 may fall within a pass band of the filter 252, and the f2 may fall beyond the pass band of the filter 252 such that when the signal that is input to the filter 252 is output, the signal includes only the signal component of the f1. This is not limited in this embodiment of the present disclosure.

Figure 7:
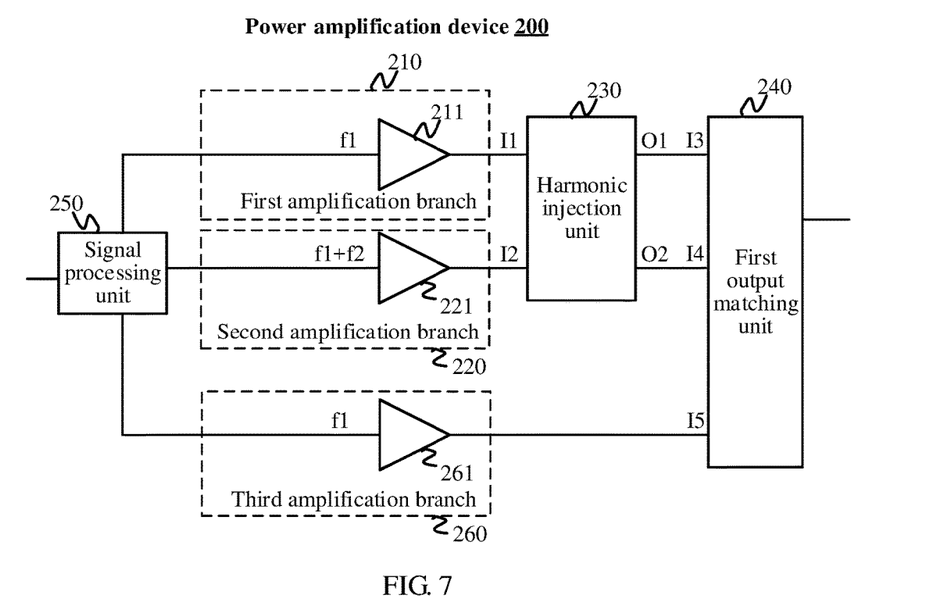
FIG. 7 is another schematic structural diagram of a power amplification device according to an embodiment of the present disclosure.

In another optional embodiment, on the basis of FIG. 6, as shown in FIG. 7, the power amplification device 200 further includes a third amplification branch 260, where the third amplification branch 260 includes a third amplifier 261 supporting the f1.

The first output matching unit 240 further includes a fifth input terminal I5, where an output terminal of the third amplification branch 260 is connected to the fifth input terminal I5 of the first output matching unit 240.

The power amplification device 200 may include one or more third amplification branches 260. The third amplifier 261 may operate at the f1, and the third amplifier 261 may have a preset enabling threshold. The third amplifier 261 is turned off for a signal having a power value less than the preset enabling threshold, and the enabling threshold of the third amplifier 261 may be the same as or different from the enabling threshold of the second amplifier 221. This is not limited in this embodiment of the present disclosure.

In this embodiment of the present disclosure, when the power amplification device 200 operates, the first input signal of the f1 is input from the input terminal of the first amplification branch 210, and the first amplification branch 210 is configured to perform amplification processing on the first input signal to obtain the first input signal having undergone amplification processing, and output the first input signal having undergone amplification processing to the harmonic injection unit 230 from the first input terminal I1 of the harmonic injection unit 230.

The second input signal is input from the input terminal of the second amplification branch 220, where the second input signal includes the first signal component of the f1 and the second signal component of the f2. The second amplification branch 220 is configured to perform amplification processing on the second input signal to obtain the second input signal having undergone amplification processing, and output the second input signal having undergone amplification processing to the harmonic injection unit 230 from the second input terminal I2 of the harmonic injection unit 230, where the second input signal having undergone amplification processing includes the second signal component having undergone amplification processing.

The harmonic injection unit 230 is configured to inject the second signal component that has undergone amplification processing and that is input from the second input terminal I2 to the first input signal that has undergone amplification processing and that is input from the first input terminal I1 to obtain the first input signal having undergone harmonic injection, and output the first input signal having undergone harmonic injection from the first output terminal O1.

The first output matching unit 240 is configured to receive the first input signal that has undergone harmonic injection and that is input from the third input terminal I3, and output the first input signal having undergone harmonic injection.

If a power value of the first signal component is lower than the enabling threshold of the second amplifier 221, the second amplifier 221 is turned off for the first signal component. In this case, the second input signal having undergone amplification processing includes the second signal component having undergone amplification processing, and correspondingly, no signal is input from the fourth input terminal I4 of the first output matching unit 240.

In another optional embodiment, if the power value of the first signal component is greater than or equal to the enabling threshold of the second amplifier 221, the second amplifier 221 is turned on for the first signal component. In this case, the second input signal having undergone amplification processing further includes the first signal component having undergone amplification processing, and the second amplification branch 220 is further configured to output the first signal component having undergone amplification processing to the harmonic injection unit 230 from the second input terminal I2.

The harmonic injection unit 230 is further configured to output the first signal component having undergone amplification processing to the first output matching unit 240 from the fourth input terminal I4.

The first output matching unit 240 is further configured to perform combination processing on the first input signal that has undergone amplification processing and that is input from the third input terminal I3 and the first signal component that has undergone amplification processing and that is input from the fourth input terminal I4 to obtain a combined signal, and output the combined signal.

Therefore, the power amplification device 200 according to this embodiment of the present disclosure includes the first amplification branch 210 supporting the f1, the second amplification branch 220 supporting the f1 and the f2, the harmonic injection unit 230, and the first output matching unit 240 configured to perform combination. The harmonic injection unit 230 injects a signal of the f2 that is output from the second amplification branch 220 to a signal of the f1 that is output from the first amplification branch 210. Power of an output signal of the power amplification device 200 can be increased, and in addition to achieving high efficiency, the power amplification device 200 has a simple circuit structure.

An embodiment of the present disclosure further provides another power amplification device. The power amplification device includes a first input terminal I1, a second input terminal I2, a processing unit, and an output terminal.

The first input terminal I1 is configured to receive a first input signal, where the first input signal includes a signal of a first frequency.

The second input terminal I2 is configured to receive a second input signal, where the second input signal includes signals of the first frequency and a second frequency.

The processing unit is configured to perform amplification processing on the first input signal to obtain the first input signal having undergone amplification processing, and perform amplification processing on the second input signal to obtain the second input signal having undergone amplification processing, where the second input signal having undergone amplification processing includes the signal of the second frequency that has undergone amplification processing.

The processing unit is further configured to inject the signal of the second frequency that has undergone amplification processing into the first input signal having undergone amplification processing to obtain a signal having undergone harmonic injection.

If the second input signal having undergone amplification processing includes the signal of the first frequency that has undergone amplification processing, the processing unit is further configured to combine the signal having undergone harmonic injection and the signal of the first frequency that has undergone amplification processing, to obtain a combined signal.

The output terminal is configured to output the signal having undergone harmonic injection or output the combined signal.

Some involved technical features, such as harmonic injection, signal combination (or combination), and signals, and a matching network or a matching circuit that is necessary in processing steps in the device are similar to or corresponding to some technical features involved in the foregoing power amplification device, and are no longer repeated in this embodiment.

Optionally, the processing unit may be implemented using the first amplification branch 210, the second amplification branch 220, the harmonic injection unit 230, and the first output matching unit 240 in the foregoing power amplification device 200. For a detailed description, refer to the foregoing embodiment, and details are not described again in this embodiment of the present disclosure.

It should be understood that, the term "and/or" in this embodiment of the present disclosure describes only an association relationship for describing associated objects and represents that three relationships may exist. For example, A and/or B may represent the following three cases. Only A exists, both A and B exist, and only B exists. In addition, the character "/" in this specification generally indicates an "or" relationship between the associated objects.

A person of ordinary skill in the art may be aware that, in combination with the examples described in the embodiments disclosed in this specification, method steps and units may be implemented by electronic hardware, computer software, or a combination thereof. To clearly describe the interchangeability between the hardware and the software, the foregoing has generally described steps and compositions of each embodiment according to functions. Whether the functions are performed by hardware or software depends on particular applications and design constraint conditions of the technical solutions. A person of ordinary skill in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present disclosure.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the other approaches, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of the present disclosure. The foregoing storage medium includes any medium that can store program code, such as a universal serial bus (USB) flash drive, a removable hard disk, a read-only memory (ROM), a random access memory (RAM), a magnetic disk, or an optical disc.

The foregoing descriptions are merely specific embodiments of the present disclosure, but are not intended to limit the protection scope of the present disclosure. Any modification or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A power amplification device, comprising:
    a first amplification branch;
    a second amplification branch;
    a harmonic injection circuit coupled to the first amplification branch and the second amplification branch; and
    a first output matching circuit coupled to the harmonic injection circuit,
    wherein the first amplification branch comprises a first amplifier supporting a first frequency,
    wherein the second amplification branch comprises a second amplifier supporting the first frequency and a second frequency,
    wherein the second amplifier is turned off for an input signal of the first frequency that has a power value lower than an enabling threshold,
    wherein the second frequency is N times the first frequency,
    wherein N is an integer greater than 1,
    wherein the harmonic injection circuit comprises:
        a first input terminal (I1);
        a second input terminal (I2);
        a first output terminal (O1); and
        a second output terminal (O2), and
    wherein the first output matching circuit comprises a third input terminal (I3) and a fourth input terminal (I4),
    wherein an output terminal of the first amplification branch is connected to the I1,
    wherein an output terminal of the second amplification branch is connected to the I2,
    wherein the O1 is connected to the I3,
    wherein the O2 is connected to the I4,
    wherein the harmonic injection circuit injects an input signal of the second frequency input from the I2 to an input signal of the first frequency input from the I1 to obtain an input signal of the first frequency that has undergone harmonic injection,
    wherein the O1 is turned on for the input signal of the first frequency input from the I1,
    wherein the O2 is turned on for a signal of the first frequency input from the I2,
    wherein the O1 and the O2 are open for the input signal of the second frequency, and
    wherein the first output matching circuit is configured to:
        combine signals input from the I3 and the I4; and
        output a combined signal.

2. The power amplification device according to claim 1, wherein the first frequency is a fundamental frequency, and wherein the second frequency is an $N^{th}$ order harmonic frequency.

3. The power amplification device according to claim 1, wherein the harmonic injection circuit comprises:
    a harmonic injection subcircuit;
    a first matching subcircuit; and
    a second matching subcircuit,
    wherein a first terminal of the harmonic injection subcircuit is separately connected to the I1 and one terminal of the first matching subcircuit,
    wherein a second terminal of the harmonic injection subcircuit is separately connected to the I2 and one terminal of the second matching subcircuit,
    wherein the harmonic injection subcircuit is open for the input signal of the first frequency and turned on for the input signal of the second frequency input from the I2,
    wherein the other terminal of the first matching subcircuit is connected to the O1,
    wherein the first matching subcircuit is turned on for the input signal of the first frequency and open for the input signal of the second frequency,
    wherein the other terminal of the second matching subcircuit is connected to the O2, and
    wherein the second matching subcircuit is turned on for the input signal of the first frequency input from the I2 and open for the input signal of the second frequency input from the I2.

4. The power amplification device according to claim 3, wherein the harmonic injection subcircuit comprises a quarter-wave line corresponding to the first frequency, wherein the first matching subcircuit comprises a first quarter-wave line corresponding to the second frequency and a second quarter-wave line corresponding to the second frequency, wherein one terminal of the first quarter-wave line is connected to the first terminal of the harmonic injection subcircuit, wherein the other terminal of the first quarter-wave line is separately connected to the O1 and one terminal of the second quarter-wave line, wherein the other terminal of the second quarter-wave line is open, wherein the second matching subcircuit comprises a third quarter-wave line corresponding to the second frequency and a fourth quarter-wave line corresponding to the second frequency, wherein one terminal of the third quarter-wave line is connected to the second terminal of the harmonic injection subcircuit, wherein the other terminal of the third quarter-wave line is separately connected to the O2 and one terminal of the fourth quarter-wave line, and wherein the other terminal of the fourth quarter-wave line is open.

5. The power amplification device according to claim 1, wherein the second amplification branch further comprises a second output matching circuit, and wherein an input terminal of the second output matching circuit is connected to an output terminal of the second amplifier.

6. The power amplification device according to claim 5, wherein the second output matching circuit comprises:
   an inductance element; and
   a capacitance element connected in parallel to the inductance element.

7. The power amplification device according to claim 1, wherein the first output matching circuit comprises:
   a first branch matching subcircuit;
   a second branch matching subcircuit; and
   a combination matching subcircuit,
   wherein one terminal of the first branch matching subcircuit is connected to the I3,
   wherein the other terminal of the first branch matching subcircuit is connected to the combination matching subcircuit,
   wherein one terminal of the second branch matching subcircuit is connected to the I4, and
   wherein the other terminal of the second branch matching subcircuit is connected to the combination matching subcircuit.

8. The power amplification device according to claim 1, further comprising a signal processing circuit, wherein output terminals of the signal processing circuit are respectively connected to an input terminal of the first amplification branch and an input terminal of the second amplification branch, and wherein the signal processing circuit is configured to:
   input a first input signal of the first frequency to the first amplification branch; and
   input a second input signal to the second amplification branch, and
   wherein the second input signal comprises a first signal component of the first frequency and a second signal component of the second frequency.

9. The power amplification device according to claim 8, wherein the signal processing circuit comprises:
   a power divider; and
   a filter,
   wherein an output terminal of the power divider is connected to an input terminal of the filter;
   wherein the other output terminal of the power divider is connected to the input terminal of the second amplification branch, and
   wherein an output terminal of the filter is connected to the input terminal of the first amplification branch.

10. The power amplification device according to claim 8, wherein a power value of the first signal component is lower than a power value of the second signal component, and wherein the power value of the second signal component is greater than or equal to the enabling threshold.

11. The power amplification device according to claim 1, further comprising a third amplification branch, wherein the third amplification branch comprises a third amplifier supporting the first frequency, wherein the first output matching circuit further comprises a fifth input terminal (I5), and wherein an output terminal of the third amplification branch is connected to the I5.

12. The power amplification device according to claim 8, wherein the first input signal of the first frequency is input from the input terminal of the first amplification branch, wherein the first amplification branch is configured to:
   perform amplification process on the first input signal to obtain a first input signal undergone the amplification process; and
   output the first input signal undergone the amplification process to the harmonic injection circuit from the I1,
   wherein the second input signal is input from the input terminal of the second amplification branch,
   wherein the second input signal comprises the first signal component of the first frequency and the second signal component of the second frequency,
   wherein the second amplification branch is configured to:
   perform the amplification process on the second input signal to obtain a second input signal undergone the amplification process; and
   output the second input signal undergone the amplification process to the harmonic injection circuit from the I2,
   wherein the second input signal undergone the amplification process comprises a second signal component undergone the amplification process,
   wherein the harmonic injection circuit is configured to:
   inject the second signal component undergone the amplification process and that is input from the I2 to the first input signal undergone the amplification process and that is input from the I1 to obtain a first input signal undergone the harmonic injection; and
   output the first input signal undergone the harmonic injection from the O1, and wherein the first output matching circuit is configured to:
   receive the first input signal undergone the harmonic injection and that is input from the I3; and
   output the first input signal undergone the harmonic injection.

13. The power amplification device according to claim 12, wherein when a power value of the first signal component is greater than or equal to the enabling threshold, the second input signal undergone the amplification process further comprises a first signal component undergone the amplification process,
   wherein the second amplification branch is further configured to output the first signal component undergone the amplification process to the harmonic injection circuit from the I2,
   wherein the harmonic injection circuit is further configured to output the first signal component undergone the amplification process to the first output matching circuit from the I4,
   wherein the first output matching circuit is further configured to:
   perform combination process on the first input signal undergone the amplification process and that is input from the I3 and the first signal component undergone the amplification process and that is input from the I4 to obtain the combined signal; and output the combined signal.

14. A base station, comprising a power amplification device, wherein the power amplification device comprises:
a first amplification branch;
a second amplification branch;
a harmonic injection circuit coupled to the first amplification branch and the second amplification branch; and
a first output matching circuit coupled to the harmonic injection circuit,
wherein the first amplification branch comprises a first amplifier supporting a first frequency,
wherein the second amplification branch comprises a second amplifier supporting the first frequency and a second frequency,
wherein the second amplifier is turned off for an input signal of the first frequency that has a power value lower than an enabling threshold,
wherein the second frequency is N times the first frequency,
wherein N is an integer greater than 1,
wherein the harmonic injection circuit comprises:
a first input terminal (I1);
a second input terminal (I2);
a first output terminal (O1); and
a second output terminal (O2),
wherein the first output matching circuit comprises a third input terminal (I3) and a fourth input terminal (I4),
wherein an output terminal of the first amplification branch is connected to the I1,
wherein an output terminal of the second amplification branch is connected to the I2,
wherein the O1 is connected to the I3,
wherein the O2 is connected to the I4,
wherein the harmonic injection circuit injects an input signal of the second frequency input from the I2 to an input signal of the first frequency input from the I1 to obtain an input signal of the first frequency that has undergone harmonic injection,
wherein the O1 is turned on for the input signal of the first frequency input from the I1,
wherein the O2 is turned on for a signal of the first frequency input from the I2,
wherein the O1 and the O2 are open for a signal of the second frequency, and
wherein the first output matching circuit is configured to: combine signals input from the I3 and the I4; and output a combined signal.

15. The base station according to claim 14, wherein the first frequency is a fundamental frequency, and wherein the second frequency is an $N^{th}$ order harmonic frequency.

16. The base station according to claim 14, wherein the harmonic injection circuit comprises:
a harmonic injection subcircuit;
a first matching subcircuit; and
a second matching subcircuit,
wherein a first terminal of the harmonic injection subcircuit is separately connected to the I1 and one terminal of the first matching subcircuit,
wherein a second terminal of the harmonic injection subcircuit is separately connected to the I2 and one terminal of the second matching subcircuit,
wherein the harmonic injection subcircuit is open for the signal of the first frequency and is turned on for the input signal of the second frequency input from the I2,
wherein the other terminal of the first matching subcircuit is connected to the O1,
wherein the first matching subcircuit is turned on for the input signal of the first frequency and is open for the input signal of the second frequency,
wherein the other terminal of the second matching subcircuit is connected to the O2, and
wherein the second matching subcircuit is turned on for the signal of the first frequency input from the I2 and is open for the signal of the second frequency input from the I2.

17. The base station according to claim 16, wherein the harmonic injection subcircuit comprises a quarter-wave line corresponding to the first frequency, wherein the first matching subcircuit comprises a first quarter-wave line corresponding to the second frequency and a second quarter-wave line corresponding to the second frequency, wherein one terminal of the first quarter-wave line is connected to the first terminal of the harmonic injection subcircuit, wherein the other terminal of the first quarter-wave line is separately connected to the O1 and one terminal of the second quarter-wave line, wherein the other terminal of the second quarter-wave line is open, wherein the second matching subcircuit comprises a third quarter-wave line corresponding to the second frequency and a fourth quarter-wave line corresponding to the second frequency, wherein one terminal of the third quarter-wave line is connected to the second terminal of the harmonic injection subcircuit, wherein the other terminal of the third quarter-wave line is separately connected to the O2 and one terminal of the fourth quarter-wave line, and wherein the other terminal of the fourth quarter-wave line is open.

18. The base station according to claim 14, wherein the second amplification branch further comprises a second output matching circuit, and wherein an input terminal of the second output matching circuit is connected to an output terminal of the second amplifier.

19. The base station according to claim 18, wherein the second output matching circuit comprises:
an inductance element; and
a capacitance element connected in parallel to the inductance element.

20. The base station according to claim 14, wherein the first output matching circuit comprises:
a first branch matching subcircuit;
a second branch matching subcircuit; and
a combination matching subcircuit,
wherein one terminal of the first branch matching subcircuit is connected to the I3,
wherein the other terminal of the first branch matching subcircuit is connected to the combination matching subcircuit,
wherein one terminal of the second branch matching subcircuit is connected to the I4, and
wherein the other terminal of the second branch matching subcircuit is connected to the combination matching subcircuit.

* * * * *